(12) United States Patent
Zheng et al.

(10) Patent No.: US 11,373,614 B2
(45) Date of Patent: Jun. 28, 2022

(54) SHIFT REGISTER UNIT AND DRIVING METHOD THEREOF, GATE DRIVE CIRCUIT, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Mindong Zheng, Beijing (CN); Hui Wang, Beijing (CN); Yifeng Zou, Beijing (CN); Ruiying Yang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 26 days.

(21) Appl. No.: 16/932,063

(22) Filed: Jul. 17, 2020

(65) Prior Publication Data
US 2021/0065643 A1 Mar. 4, 2021

(30) Foreign Application Priority Data
Aug. 26, 2019 (CN) .......................... 201910788054.1

(51) Int. Cl.
*G09G 3/36* (2006.01)
*G11C 19/28* (2006.01)

(52) U.S. Cl.
CPC ........... *G09G 3/3677* (2013.01); *G11C 19/28* (2013.01); *G09G 2310/0286* (2013.01); *G09G 2310/08* (2013.01)

(58) Field of Classification Search
CPC ........ G09G 3/36; G09G 3/20; G09G 2310/08; G09G 2300/0426; G09G 2310/0286;
(Continued)

(56) References Cited

U.S. PATENT DOCUMENTS

| 10,950,320 B2 * | 3/2021 | Xie | ..................... G09G 3/20 |
| 2008/0116944 A1 * | 5/2008 | Tobita | ................... G11C 19/28 |
| | | | 377/79 |

(Continued)

FOREIGN PATENT DOCUMENTS

| CN | 105185349 A | 12/2015 |
| CN | 106373538 A | 2/2017 |

(Continued)

OTHER PUBLICATIONS

First Office Action dated Jan. 26, 2021, relating to CN Patent Application No. 201910788054.1.

*Primary Examiner* — Olga V Merkoulova
(74) *Attorney, Agent, or Firm* — Dinsmore & Shohl LLP

(57) ABSTRACT

A shift register unit and a driving method thereof, a gate drive circuit, and a display device are provided. The shift register unit includes: an input circuit configured to control a potential of a first node; a first output circuit configured to output a carry signal to a first output terminal of the shift register unit through an output terminal of the first output circuit, under control of the potential and a clock signal; a second output circuit configured to output a driving signal to a second output terminal of the shift register unit, under control of the potential and the clock signal; a switching circuit configured to control the output terminal to be electrically connected to the first output terminal in response to a control signal; and a potential control circuit configured to control the output terminal to be electrically connected to a first voltage terminal.

19 Claims, 8 Drawing Sheets

(58) Field of Classification Search
CPC .............. G09G 3/3208; G09G 3/3648; G09G 2354/00; G09G 2330/021
See application file for complete search history.

(56) References Cited

U.S. PATENT DOCUMENTS

| | | | |
|---|---|---|---|
| 2009/0256794 A1* | 10/2009 | Jang | G11C 19/28 345/100 |
| 2014/0010341 A1* | 1/2014 | Wu | G11C 19/28 377/78 |
| 2016/0266700 A1* | 9/2016 | Ji | G09G 3/3674 |
| 2016/0293269 A1 | 10/2016 | Lim et al. | |
| 2017/0124936 A1 | 5/2017 | Tseng et al. | |
| 2017/0270851 A1 | 9/2017 | Shang et al. | |
| 2019/0122625 A1* | 4/2019 | Pu | G09G 3/3677 |
| 2019/0213970 A1* | 7/2019 | Wang | G11C 19/28 |
| 2019/0236995 A1 | 8/2019 | Du et al. | |
| 2019/0392916 A1 | 12/2019 | Gu et al. | |
| 2020/0027382 A1* | 1/2020 | Wang | G09G 3/20 |
| 2020/0105357 A1* | 4/2020 | Xie | G09G 3/3677 |
| 2020/0243034 A1 | 7/2020 | Gu et al. | |
| 2021/0065643 A1* | 3/2021 | Zheng | G11C 19/28 |

FOREIGN PATENT DOCUMENTS

| | | |
|---|---|---|
| CN | 108257568 A | 7/2018 |
| CN | 108305581 A | 7/2018 |
| CN | 108597437 A | 9/2018 |
| CN | 108932933 A | 12/2018 |
| CN | 109147704 A | 1/2019 |
| CN | 109785787 A | 5/2019 |

* cited by examiner

SHIFT REGISTER UNIT AND DRIVING METHOD THEREOF, GATE DRIVE CIRCUIT, AND DISPLAY DEVICE

CROSS-REFERENCE TO RELATED APPLICATIONS

The present disclosure is based on and claims priority to China Patent Application No. 201910788054.1 filed on Aug. 26, 2019, the disclosure of which is incorporated by reference herein in its entirety.

TECHNICAL FIELD

The present disclosure relates to a shift register unit and a driving method thereof, a gate drive circuit, and a display device.

BACKGROUND

With the rapid development of display technology, a gate drive circuit on an array substrate (Gate driving On Array, GOA) is gradually used to drive a liquid crystal display panel.

In the related art, GOA is present with an abnormal driving phenomenon when driving a liquid crystal display panel, which affects normal display of a display screen.

SUMMARY

According to one aspect of the embodiments of the present disclosure, provided is a shift register unit, comprising: an input circuit electrically connected to a first node, and configured to control a potential of the first node under control of an input signal of an input terminal; a first output circuit configured to output a carry signal to a first output terminal of the shift register unit through an output terminal of the first output circuit, under control of the potential of the first node and a clock signal of a clock signal terminal; a second output circuit configured to output a driving signal to a second output terminal of the shift register unit, under control of the potential of the first node and the clock signal of the clock signal terminal; a switching circuit electrically connected to the output terminal of the first output circuit and the first output terminal, and configured to control the output terminal of the first output circuit to be electrically connected to the first output terminal in response to a control signal; and a potential control circuit configured to control the output terminal of the first output circuit to be electrically connected to a first voltage terminal.

In some embodiments, the shift register unit further comprises: a first reset circuit configured to reset the first node in response to a first reset signal of a first reset terminal during a display phase; and a second reset circuit configured to reset the first node in response to a second reset signal of a second reset terminal during a field blanking phase.

In some embodiments, the control signal comprises a first control signal and a second control signal, and the switching circuit comprises: a first transistor, of which a control terminal is configured to receive the first control signal, a first terminal is electrically connected to the output terminal of the first output circuit, and a second terminal is electrically connected to the first output terminal; and a second transistor, of which a control terminal is configured to receive the second control signal, a first terminal is electrically connected to the output terminal of the first output circuit, and a second terminal is electrically connected to the first output terminal.

In some embodiments, one of the first control signal and the second control signal is the same as the clock signal.

In some embodiments, the first voltage terminal is configured to receive the second reset signal.

In some embodiments, the shift register unit further comprises: a first noise reduction circuit electrically connected to the first node and a second node, and configured to control a potential of the second node to be at a second level logically opposite to a first level in a case where a potential of the first node is at the first level, wherein the potential control circuit is electrically connected to the second node.

In some embodiments, the potential control circuit comprises: a third transistor, of which a control terminal is electrically connected to the second node, a first terminal is electrically connected to the output terminal of the first output circuit, and a second terminal is electrically connected to the first voltage terminal.

In some embodiments, the shift register unit further comprises: a second noise reduction circuit electrically connected to the first node and a third node, and configured to control the potential of the second node to be at the second level in the case where the potential of the first node is at the first level, wherein the potential control circuit is configured to control the output terminal of the first output circuit to be electrically connected to the first voltage terminal under control of one of the potential of the second node and a potential of the third node.

In some embodiments, the potential control circuit comprises: a fourth transistor, of which a control terminal is electrically connected to the second node, a first terminal is electrically connected to the output terminal of the first output circuit, and a second terminal is electrically connected to the first voltage terminal; and a fifth transistor, of which a control terminal is electrically connected to the third node, a first terminal is electrically connected to the output terminal of the first output circuit, and a second terminal is electrically connected to the first voltage terminal.

In some embodiments, the shift register unit further comprises: a third reset circuit electrically connected to the second node, the third node and the second output terminal, and configured to reset the second output terminal under control of one of the potential of the second node and the potential of the third node; and a potential maintaining circuit electrically connected to the first node, the second node and the third node, and configured to maintain the potential of the first node under control of one of the potential of the second node and the potential of the third node.

In some embodiments, the input circuit comprises: a sixth transistor, of which a control terminal and a first terminal are electrically connected to the input terminal, and a second terminal is electrically connected to the first node; the first output circuit comprises: a seventh transistor, of which a control terminal is electrically connected to the first node, a first terminal is electrically connected to the clock signal terminal, and a second terminal serves as the output terminal of the first output circuit; the second output circuit comprises: an eighth transistor, of which a control terminal is electrically connected to the first node, a first terminal of the eighth transistor is electrically connected to the clock signal terminal, and a second terminal is electrically connected to the second output terminal, and a capacitor, of which a first terminal is electrically connected to the first node, and a second terminal is electrically connected to the second output terminal; the first reset circuit comprises: a ninth transistor, of which a control terminal is configured to receive the first reset signal, a first terminal is electrically connected to the first node, and a second terminal is electrically connected to a second voltage terminal; the first noise reduction circuit comprises: a tenth transistor, of which a first terminal is electrically connected to a third voltage terminal, and a second terminal is electrically connected to the second node, an eleventh transistor, of which a control terminal is electrically connected to the first node, a first terminal is electrically connected to the second node, and a second terminal is electrically connected to the second voltage terminal, a twelfth transistor, of which a control terminal and a first terminal are electrically connected to the third voltage terminal, and a second terminal is electrically connected to a control terminal of the tenth transistor, and a thirteenth transistor, of which a control terminal is electrically connected to the first node, a first terminal is electrically connected to the second terminal of the twelfth transistor, and a second terminal is electrically connected to the second voltage terminal; the second noise reduction circuit comprises: a fourteenth transistor, of which a first terminal is electrically connected to a fourth voltage terminal, and a second terminal is electrically connected to the third node, a fifteenth transistor, of which a control terminal is electrically connected to the first node, a first terminal is electrically connected to the third node, and a second terminal is electrically connected to the second voltage terminal, a sixteenth transistor, of which a control terminal and a first terminal are electrically connected to the fourth voltage terminal, and a second terminal is electrically connected to a control terminal of the fourteenth transistor, and a seventeenth transistor, of which a control terminal is electrically connected to the first node, a first terminal is electrically connected to the second terminal of the sixteenth transistor, and a second terminal is electrically connected to the second voltage terminal; the second reset circuit comprises: an eighteenth transistor, of which a control terminal is configured to receive the second reset signal, a first terminal is electrically connected to the first node, and a second terminal is electrically connected to the second voltage terminal; the third reset circuit comprises: a nineteenth transistor, of which a control terminal is electrically connected to the second node, a first terminal is electrically connected to the second output terminal, and a second terminal is electrically connected to a fifth voltage terminal, and a twentieth transistor, of which a control terminal is electrically connected to the third node, a first terminal is electrically connected to the second output terminal, and a second terminal is electrically connected to the fifth voltage terminal; the potential maintaining circuit comprises: a twenty-first transistor, of which a control terminal is electrically connected to the second node, a first terminal is electrically connected to the first node, and a second terminal is electrically connected to the second voltage terminal, and a twenty-second transistor, of which a control terminal is electrically connected to the third node, a first terminal is electrically connected to the first node, and a second terminal is electrically connected to the second voltage terminal.

In some embodiments, the control signal comprises a first control signal and a second control signal; the switching circuit comprises: a first transistor, of which a control terminal is configured to receive the first control signal, a first terminal is electrically connected to the output terminal of the first output circuit, and a second terminal is electrically connected to the first output terminal, and a second transistor, of which a control terminal is configured to receive the second control signal, a first terminal is electrically connected to the output terminal of the first output circuit, and a second terminal is electrically connected to the first output terminal; the potential control circuit comprises: a fourth transistor, of which a control terminal is electrically connected to the second node, a first terminal is electrically connected to the output terminal of the first output circuit, and a second terminal is electrically connected to the first voltage terminal, and a fifth transistor, of which a control terminal is electrically connected to the third node, a first terminal is electrically connected to the output terminal of the first output circuit, and a second terminal is electrically connected to the first voltage terminal; the input circuit comprises: a sixth transistor, of which a control terminal and a first terminal are electrically connected to the input terminal, and a second terminal is electrically connected to the first node; the first output circuit comprises: a seventh transistor, of which a control terminal is electrically connected to the first node, a first terminal is electrically connected to the clock signal terminal, and a second terminal serves as the output terminal of the first output circuit; the second output circuit comprises: an eighth transistor, of which a control terminal is electrically connected to the first node, a first terminal of the eighth transistor is electrically connected to the clock signal terminal, and a second terminal is electrically connected to the second output terminal, and a capacitor, of which a first terminal is electrically connected to the first node, and a second terminal is electrically connected to the second output terminal; and the shift register unit further comprises: a ninth transistor, of which a control terminal is configured to receive the first reset signal, a first terminal is electrically connected to the first node, and a second terminal is electrically connected to a second voltage terminal; a tenth transistor, of which a first terminal is electrically connected to a third voltage terminal, and a second terminal is electrically connected to the second node; an eleventh transistor, of which a control terminal is electrically connected to the first node, a first terminal is electrically connected to the second node, and a second terminal is electrically connected to the second voltage terminal; a twelfth transistor, of which a control terminal and a first terminal are electrically connected to the third voltage terminal, and a second terminal is electrically connected to a control terminal of the tenth transistor; and a thirteenth transistor, of which a control terminal is electrically connected to the first node, a first terminal is electrically connected to the second terminal of the twelfth transistor, and a second terminal is electrically connected to the second voltage terminal; a fourteenth transistor, of which a first terminal is electrically connected to a fourth voltage terminal, and a second terminal is electrically connected to the third node; a fifteenth transistor, of which a control terminal is electrically connected to the first node, a first terminal is electrically connected to the third node, and a second terminal is electrically connected to the second voltage terminal; a sixteenth transistor, of which a control terminal and a first terminal are electrically connected to the fourth voltage terminal, and a second terminal is electrically connected to a control terminal of the fourteenth transistor; a seventeenth transistor, of which a control terminal is electrically connected to the first node, a first terminal is electrically connected to the second terminal of the sixteenth transistor, and a second terminal is electrically connected to the second voltage terminal; an eighteenth transistor, of which a control terminal is configured to receive the second reset signal, a first terminal is electrically connected to the first node, and a second terminal is electrically connected to the second voltage terminal; a nineteenth transistor, of which a control terminal is electrically connected to the second node, a first terminal is electrically connected to the second output terminal, and a second terminal is electrically connected to a fifth voltage terminal; a twentieth transistor, of which a control terminal is electrically connected to the third node, a first terminal is electrically connected to the second output terminal, and a second terminal is electrically connected to the fifth voltage terminal; a twenty-first transistor, of which a control terminal is electrically connected to the second node, a first terminal is electrically connected to the first node, and a second terminal is electrically connected to the second voltage terminal; and a twenty-second transistor, of which a control terminal is electrically connected to the third node, a first terminal is electrically connected to the first node, and a second terminal is electrically connected to the second voltage terminal.

According to another aspect of the embodiments of the present disclosure, provided is a gate drive circuit, comprising cascaded multi-stage shift register units, of which each stage shift register unit comprises: an input circuit electrically connected to a first node, and configured to control a potential of the first node under control of an input signal of an input terminal; a first output circuit configured to output a carry signal to a first output terminal of the shift register unit through an output terminal of the first output circuit, under control of the potential of the first node and a clock signal of a clock signal terminal; a second output circuit configured to output a driving signal to a second output terminal of the shift register unit, under control of the potential of the first node and the clock signal of the clock signal terminal; a switching circuit electrically connected to the output terminal of the first output circuit and the first output terminal, and configured to control the output terminal of the first output circuit to be electrically connected to the first output terminal in response to a control signal; and a potential control circuit configured to control the output terminal of the first output circuit to be electrically connected to a first voltage terminal.

According to an aspect of the embodiments of the present disclosure, each stage shift register unit further comprises: a first reset circuit configured to reset the first node in response to a first reset signal of a first reset terminal during a display phase; and a second reset circuit configured to reset the first node in response to a second reset signal of a second reset terminal during a field blanking phase.

According to an aspect of the embodiments of the present disclosure, the first output terminal of a N-th stage shift register unit is electrically connected to the input terminal of a (N+2)-th stage shift register unit, and the first reset terminal of the N-th stage shift register unit is electrically connected to the first output terminal of a (N+3)-th stage shift register unit, wherein N is an integer greater than 0; and the clock signal of the clock signal terminal of a (4n+1)-th stage shift register unit is a first clock signal, the clock signal of the clock signal terminal of a (4n+2)-th stage shift register unit is a second clock signal, the clock signal of the clock signal terminal of a (4n+3)-th stage shift register is a third clock signal, and the clock signal of the clock signal terminal of a (4n+4)-th stage shift register unit is a fourth clock signal, wherein n is an integer greater than or equal to 0, the first clock signal is complementary to the third clock signal, and the second clock signal is complementary to the fourth clock signal.

According to an aspect of the embodiments of the present disclosure, the switching circuit of a i-th stage shift register unit is configured to control the output terminal of the first output circuit of the i-th stage shift register unit to be electrically connected to the first output terminal of the i-th stage shift register unit, in response to the first clock signal and the third clock signal, wherein i is an odd number.

According to an aspect of the embodiments of the present disclosure, the switching circuit of a j-th stage shift register unit is configured to control the output terminal of the first output circuit of the j-th stage shift register unit to be electrically connected to the first output terminal of the j-th stage shift register unit, in response to the second clock signal and the fourth clock signal, wherein j is an even number.

According to an aspect of the embodiments of the present disclosure, the switching circuit of a i-th stage shift register unit is configured to control the output terminal of the first output circuit of the i-th stage shift register unit to be electrically connected to the first output terminal of the i-th stage shift register unit, in response to the first clock signal and the third clock signal, wherein i is an odd number; and the switching circuit of a j-th stage shift register unit is configured to control the output terminal of the first output circuit of the j-th stage shift register unit to be electrically connected to the first output terminal of the j-th stage shift register unit, in response to the second clock signal and the fourth clock signal, wherein j is an even number.

According to an aspect of the embodiments of the present disclosure, provided is a display device, comprising the gate drive circuit according to any one of the above embodiments.

According to an aspect of the embodiments of the present disclosure, provided is a driving method of a shift register unit, the shift register unit comprising: an input circuit electrically connected to a first node, and configured to control a potential of the first node under control of an input signal of an input terminal; a first output circuit configured to output a carry signal to a first output terminal of the shift register unit through an output terminal of the first output circuit, under control of the potential of the first node and a clock signal of a clock signal terminal; a second output circuit configured to output a driving signal to a second output terminal of the shift register unit, under control of the potential of the first node and the clock signal of the clock signal terminal; a switching circuit electrically connected to the output terminal of the first output circuit and the first output terminal, and configured to control the output terminal of the first output circuit to be electrically connected to the first output terminal in response to a control signal; a potential control circuit configured to control the output terminal of the first output circuit to be electrically connected to a first voltage terminal; a first reset circuit configured to reset the first node in response to a first reset signal of a first reset terminal; and a second reset circuit configured to reset the first node in response to a second reset signal of a second reset terminal. The driving method comprises: in a first stage of a display phase, controlling a potential of the first node to be at a first level, and controlling the output terminal of the first output circuit to be electrically connected to the first output terminal, to make the first output circuit output the carry signal to the first output terminal through the output terminal of the first output circuit, and make the second output circuit output the driving signal to the second output terminal; in a second stage of the display phase, resetting the first node to make the potential of the first node be at a second level, controlling the output terminal of the first output circuit to be electrically connected to the first output terminal, and controlling a potential of the output terminal of the first output circuit to be at the second level, wherein the second level is logically opposite to the first level; and in a field blanking stage, resetting the first node to make the potential of the first node be at the second level, controlling the output terminal of the first output circuit to be disconnected from the first output terminal, and controlling the potential of the output terminal of the first output circuit to be at the first level.

Other features, aspects and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
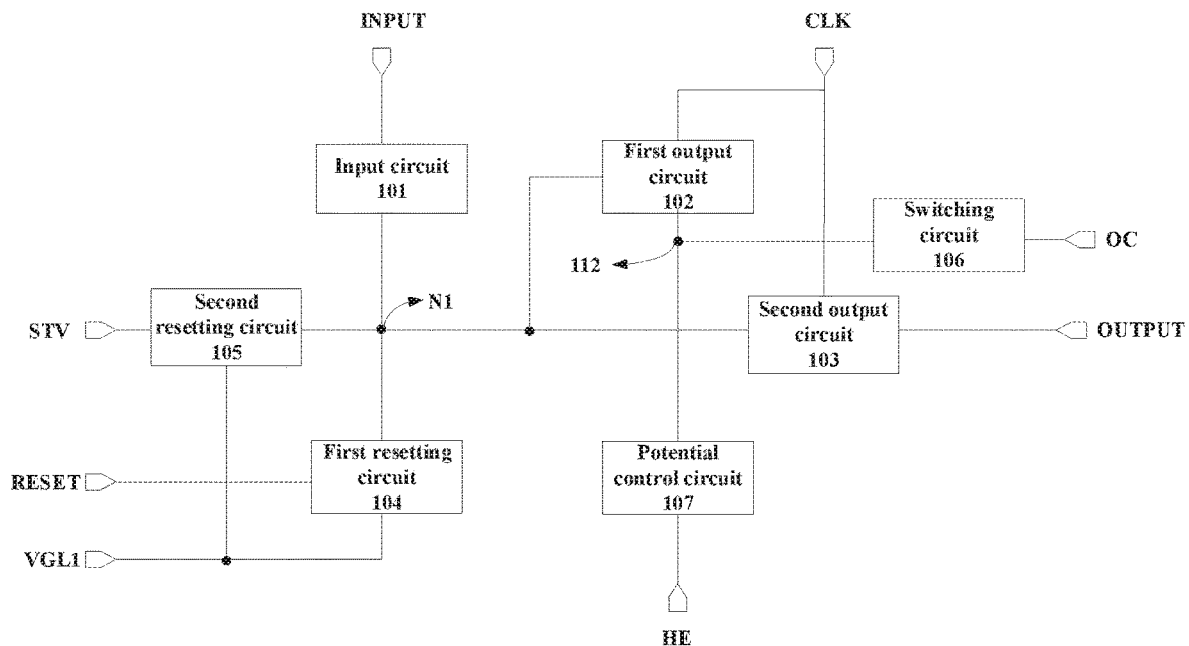
FIG. 1 is a schematic structure view showing a shift register unit according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors have noticed that there is a positive drift phenomenon in the threshold voltage of the transistor in the output circuit that outputs a carry signal. That is, the threshold voltage of the transistor increases with the elapse of time during use, which results in an unstable voltage of the carry signal output by the shift register unit.

The carry signal output by a stage shift register unit might be output to an input terminal of a latter stage shift register unit and a reset terminal of a previous stage shift register unit. However, as the threshold voltage of the transistor gradually increases, the voltage of the carry signal output by the shift register unit will gradually decrease. This results in that the latter stage shift register unit cannot be driven normally, and the previous stage shift register unit cannot be reset normally, thereby affecting the display effect.

Accordingly, the embodiments of the present disclosure propose the following technical solutions.

FIG. 1 is a schematic structure view showing a shift register unit according to an embodiment of the present disclosure.

As shown in FIG. 1, the shift register unit comprises an input circuit 101, a first output circuit 102, a second output circuit 103, a switching circuit 106, and a potential control circuit 107. The input circuit 101, the first output circuit 102, and the second output circuit 103 are electrically connected to a first node N1. In some embodiments, the shift register unit may further comprise a first reset circuit 104 and a second reset circuit 105. The first reset circuit 104 and the second reset circuit 105 are both electrically connected to the first node N1.

The input circuit 101 is configured to control a potential of the first node N1 under control of an input signal of an input terminal INPUT. For example, under control of the input signal of the input terminal INPUT, the input circuit 101 may charge the first node N1 so that the potential of the first node N1 is at a high level.

The first output circuit 102 is configured to output a carry signal to a first output terminal OC of the shift register unit through an output terminal 112 of the first output circuit 102, under control of the potential of the first node N1 and a clock signal of a clock signal terminal CLK.

The second output circuit 103 is configured to output a driving signal to a second output terminal OUTPUT of the shift register unit, under control of the potential of the first node N1 and the clock signal of the clock signal terminal CLK. It should be understood that the above carry signal and driving signal each is essentially the clock signal of the clock signal terminal CLK. The carry signal may be input to the input terminal of a latter stage shift register unit and the reset terminal of a previous stage shift register unit, and the driving signal may be input to a gate line.

For example, in a case where the potential of the first node N1 is at a high level and the clock signal of the clock signal terminal CLK is at a low level, the first output circuit 102 outputs a carry signal at a low level to the first output terminal OC, and the second output circuit 103 outputs a driving signal at a low level to the second output terminal OUTPUT. For another example, in a case where the potential of the first node N1 is at a high level and the clock signal of the clock signal terminal CLK is at a high level, the first output circuit 102 outputs a carry signal at a high level to the first output terminal OC, and the second output circuit 103 outputs a driving signal at a high level to the second output terminal OUTPUT.

The first reset circuit 104 is configured to reset the first node N1 in response to a first reset signal of a first reset terminal RESET during a display phase. For example, the first reset circuit 104 may pull the potential of the first node N1 to a low level during the display phase.

The second reset circuit 105 is configured to reset the first node N1 in response to a second reset signal of a second reset terminal STV during a field blanking phase. For example, the second reset circuit 105 may pull the potential of the first node N1 to a low level during the field blanking stage. For example, the second reset signal may be a global reset signal. It should be understood that the global reset signal also resets the first nodes N1 of other shift register units during the field blanking stage.

The switching circuit 106 is electrically connected to the output terminal 112 of the first output circuit 102 and the first output terminal OC. The switching circuit 106 is configured to control the output terminal 112 of the first output circuit 102 to be electrically connected to the first output terminal OC in response to a control signal. It should be understood that the switching circuit 106 may control whether the output terminal 112 of the first output circuit 102 is electrically connected to the first output terminal OC. In a case where the switching circuit 106 is turned on, the output terminal 112 of the first output circuit 102 is electrically connected to the first output terminal OC; and in a case where the switching circuit 106 is not turned on, the output terminal 112 of the first output circuit 102 is disconnected from the first output terminal OC.

The potential control circuit 107 is configured to control the output terminal 112 of the first output circuit 102 to be electrically connected to a first voltage terminal HE.

For example, in a case where the potential control circuit 107 is turned on, the potential control circuit 107 may control the output terminal 112 of the first output circuit 102 to be of a potential of the first voltage terminal HE.

It should be understood that the potential of the output terminal 112 of the first output circuit 102 may be controlled by controlling the potential of the first voltage terminal HE. In some embodiments, the first voltage terminal HE may be configured to receive the second reset signal. In this case, the potential of the output terminal 112 of the first output circuit 102 is the same as the potential of the second reset signal.

In the above embodiments, the shift register unit comprises the input circuit 101, the first output circuit 102, the second output circuit 103, the switching circuit 106, and the potential control circuit 107. The switching circuit 106 can control the output terminal 112 of the first output circuit 102 to be electrically connected to the first output terminal OC, and the potential control circuit 107 can control the output terminal 112 of the first output circuit 102 to be electrically connected to the first voltage terminal HE. Such a shift register unit may stabilize the voltage of the carry signal output by the first output circuit 102.

Figure 10:
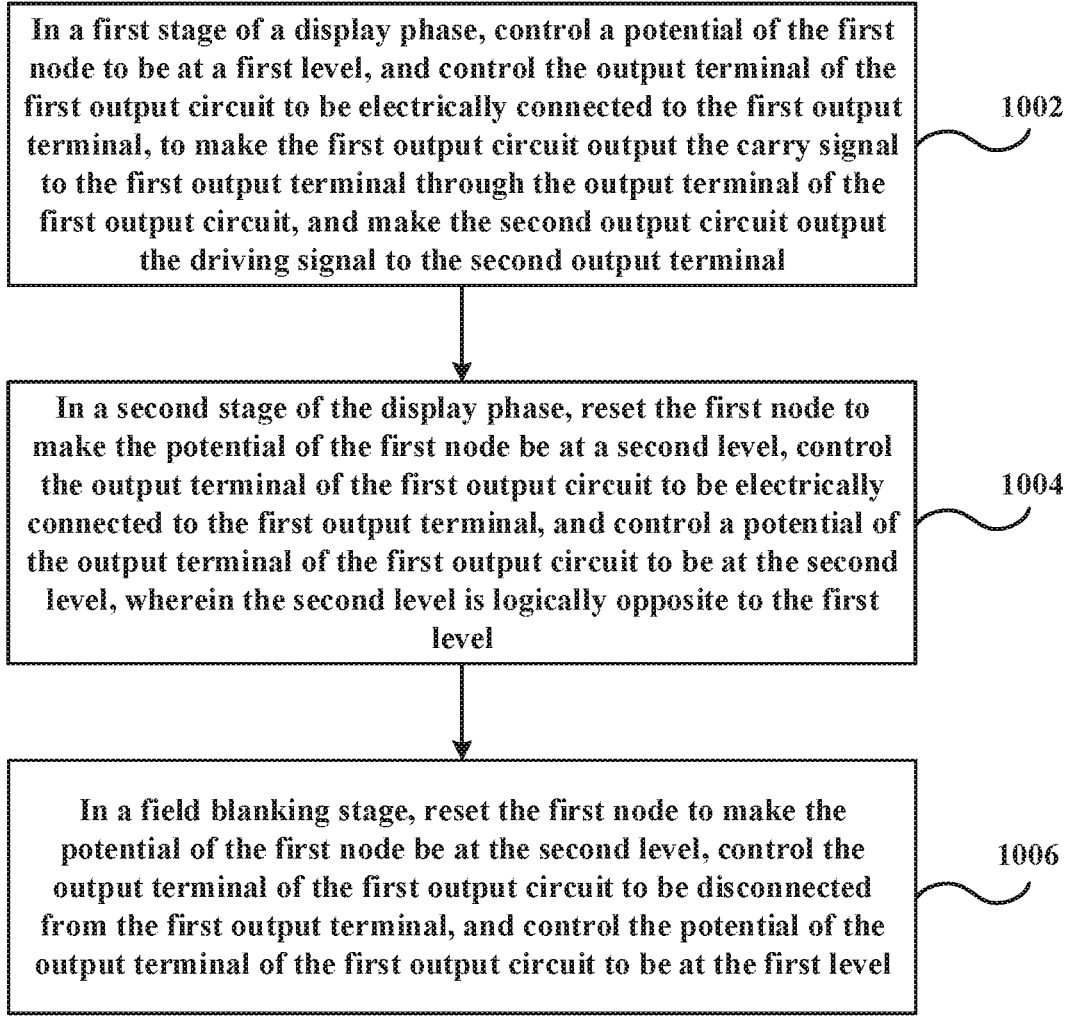
FIG. 10 is a schematic flow chart showing a driving method of a shift register unit according to an embodiment of the present disclosure.

The driving method of the shift register unit shown in FIG. 1 will be introduced below in conjunction with FIG. 10. The driving method may comprise a display phase and a field blanking phase. In some embodiments, the display phase may comprise a first stage and a second stage.

At step 1002, in the first stage of the display phase, the potential of the first node N1 is controlled to be at a first level, and the output terminal 112 of the first output circuit 102 is controlled to be electrically connected to the first output terminal OC, to make the first output circuit 102 output a carry signal to the first output terminal OC through the output terminal 112 of the first output circuit 102, and make the second output circuit 103 output a driving signal to the second output terminal OUTPUT.

At step 1004, in the second stage of the display phase, the first node N1 is reset to make the potential of the first node N1 be at the second level, the output terminal 112 of the first output circuit 102 is controlled to be electrically connected to the first output terminal OC, and the potential of the output terminal 112 of the first output circuit 102 is controlled to be at the second level. Here, the second level is logically opposite to the first level. For example, the second level is a low level and the first level is a high level, and vice versa. Since the output terminal 112 of the first output circuit 102 is electrically connected to the first output terminal OC, the potential of the first output terminal OC is also at the second level. It should be understood that the second stage is the reset stage of the display phase.

At step 1006, during the field blanking stage, the first node N1 is reset to be of the potential at the second level, the output terminal 112 of the first output circuit 102 is controlled to be disconnected from the first output terminal OC, and the potential of the output terminal 112 of the first output circuit 102 is controlled to be at the first level.

In some implementations, the first voltage terminal HE may be configured to receive the second reset signal. For example, the second reset signal is at the second level during the display phase, and at the first level within a part of time during the field blanking phase. In this way, the electric potential of the output terminal 112 of the first output circuit 102 may be controlled to be at the first level within the part of time during the field blanking phase.

In the related art, during the field blanking stage, the potential of the first node N1 is at the second level, and the potentials of the output terminal 112 and the first output terminal OC of the first output circuit 102 are also at the second level.

In the above driving method, during the field blanking stage, the potential of the first node N1 is at the second level, and the potential of the output terminal 112 of the first output circuit 102 is at the first level that is logically opposite to the second level. In this manner, the drift of the threshold voltage of the transistor in the first output circuit 102 may be compensated to stabilize the voltage of the carry signal output by the first output circuit 102. In addition, since the output terminal 112 of the first output circuit 102 is disconnected from the first output terminal OC, the potential of the first output terminal OC may still be maintained at the second level, which will not result in an abnormal potential of the first output terminal OC during the field blanking phase.

The followings will describe how to maintain the voltage of the carry signal output by the first output circuit 102 stable taking the first output circuit 102 comprising an N-type transistor as an example.

The control terminal of the N-type transistor is electrically connected to the first node N1, the first terminal of the N-type transistor is electrically connected to the clock signal terminal CLK, and the second terminal of the N-type transistor serves as the output terminal 112 of the first output circuit 102.

During the first stage of the display phase, the difference between the potential of the control terminal of the N-type transistor and the potential of the second terminal of the N-type transistor is greater than 0, and the threshold voltage of the N-type transistor increases. During the field blanking stage, the potential of the control terminal of the N-type transistor is at a low level, and the potential of the second terminal of the N-type transistor is at a high level, and thus the difference between the potential of the control terminal of the N-type transistor and the potential of the second terminal of the N-type transistor is less than 0, and the threshold voltage of the N-type transistor decreases.

Therefore, the drift of the threshold voltage of the N-type transistor may be compensated in the above manner, so that the voltage of the carry signal output by the first output circuit 102 is stable.

It should be noted that in the present disclosure, the control terminal of a transistor may be understood as the gate of the transistor, and one of the first terminal and second terminal of the transistor may be understood as the source of the transistor, and the other may be understood as the drain of the transistor.

Figure 2:
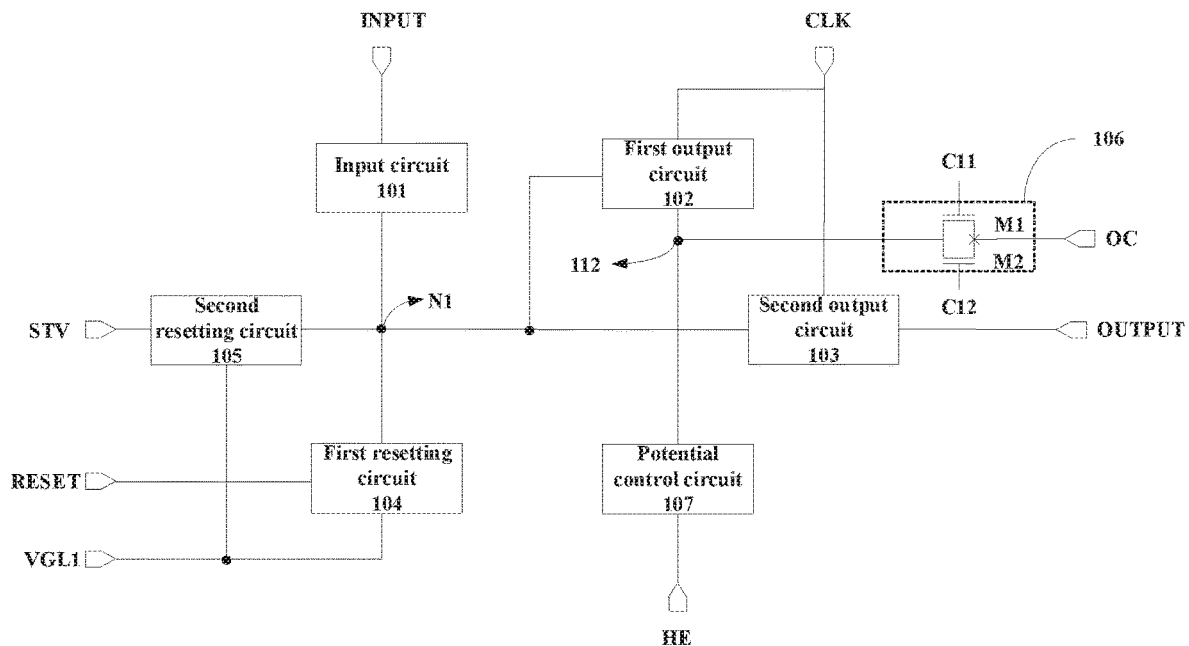
FIG. 2 is a schematic structure view showing a shift register unit according to another embodiment of the present disclosure.

FIG. 2 is a schematic structure view showing a shift register unit according to another embodiment of the present disclosure.

In FIG. 2, the control signal for controlling the switching circuit 106 may comprise a first control signal C11 and a second control signal C12. The switching circuit 106 may comprise a first transistor M1 and a second transistor M2.

The control terminal of the first transistor M1 is configured to receive the first control signal C11, the first terminal of the first transistor M1 is electrically connected to the output terminal 112 of the first output circuit 102, and the second terminal of the first transistor M1 is electrically connected to the first output terminal OC. The control terminal of the second transistor M2 is configured to receive the second control signal C12, the first terminal of the second transistor M2 is electrically connected to the output terminal 112 of the first output circuit 102, and the second terminal of the second transistor M2 is electrically connected to the first output terminal OC.

In some embodiments, one of the first control signal C11 and the second control signal C12 may be the same as the clock signal of the clock signal terminal CLK.

In some embodiments, the first transistor M1 and the second transistor M2 may be both N-type transistors or both P-type transistors. In this case, the first control signal C11 may be complementary to the second control signal C12. That is, in a case where the first control signal is at a high level, the second control signal is at a low level; and in a case where the first control signal is at a low level, the second control signal is at a high level.

In other embodiments, one of the first transistor M1 and the second transistor M2 may be an N-type transistor, and the other may be a P-type transistor. In this case, the first control signal C11 and the second control signal C12 may be the same.

In the above manner, during the display phase, the first transistor M1 and the second transistor M2 may be turned on alternately, thereby delaying the drift of the threshold voltage of the first transistor M1 and the threshold voltage of the second transistor M2.

Figure 3A:
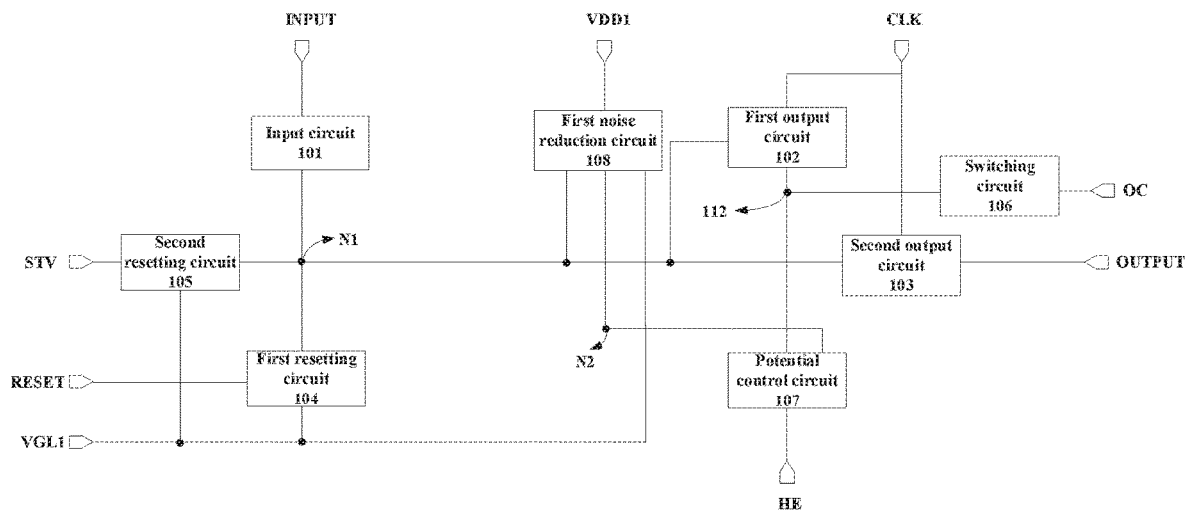
FIG. 3A is a schematic structure view showing a shift register unit according to a further embodiment of the present disclosure.

FIG. 3A is a schematic structure view showing a shift register unit according to a further embodiment of the present disclosure.

Compared with FIG. 1, the shift register unit shown in FIG. 3A may further comprise a first noise reduction circuit 108.

The first noise reduction circuit 108 is electrically connected to the first node N1 and the second node N2. The potential control circuit 107 is electrically connected to the second node N2. The first noise reduction circuit 108 is configured to, in the case where the potential of the first node N is at the first level, control the potential of the second node N2 to be at the second level logically opposite to the first level. For example, the first noise reduction circuit 108 may be electrically connected between a second voltage terminal VGL1 and a third voltage terminal VDD1. In a case where the potential of the first node N1 is at a high level, the potential of the second node N2 is controlled to be at a low level. For example, the potential of the second node N2 may be pulled to the potential of the second voltage terminal VGL1 which is at a low level. In a case where the potential of the first node N1 is at a low level, the potential of the second node N2 is controlled to be at a high level. For example, the potential of the second node N2 may be pulled to the potential of the third voltage terminal VDD1 which is at a high level.

As shown in FIG. 3A, in some implementations, the potential control circuit 107 is configured to control the output terminal 112 of the first output circuit 102 to be electrically connected to the first voltage terminal HE under control of the potential of the second node N2.

Figure 3B:
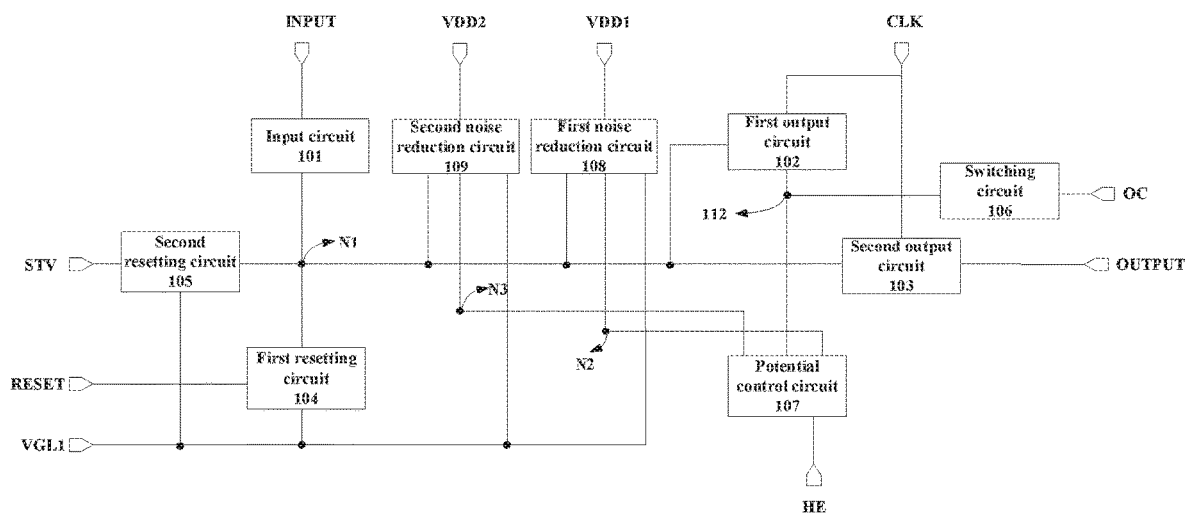
FIG. 3B is a schematic structure view showing a shift register unit according to yet another embodiment of the present disclosure.

FIG. 3B is a schematic structure view showing a shift register unit according to yet another embodiment of the present disclosure.

Compared with FIG. 3A, the shift register unit shown in FIG. 3B may further comprise a second noise reduction circuit 109.

The second noise reduction circuit 109 is electrically connected to the first node N1 and the third node N3. The second noise reduction circuit 109 is configured to control the potential of the third node N3 to be at the second level in the case where the potential of the first node N1 is at the first level. For example, the second noise reduction circuit 109 may be electrically connected between the second voltage terminal VGL1 and a fourth voltage terminal VDD2. In the case where the potential of the first node N1 is at a high level, the potential of the third node N3 is controlled to be at a low level. For example, the potential of the third node N3 may be pulled to the potential of the second voltage terminal VGL1 which is at a low level. In the case where the potential of the first node N1 is at a low level, the potential of the third node N3 is controlled to be at a high level. For example, the potential of the third node N3 may be pulled to the potential of the fourth voltage terminal VDD2 which is at a high level.

As shown in FIG. 3B, the potential control circuit 107 may be configured to control the output terminal 112 of the first output circuit 102 to be electrically connected to the first voltage terminal HE under control of one of the potential of the second node N2 and the potential of the third node N3.

One of the first noise reduction circuit 108 and the second noise reduction circuit 109 may be controlled to operate and the other not operate by controlling the potentials of the third voltage terminal VDD1 and the fourth voltage terminal VDD2. For example, the potentials of the third voltage terminal VDD1 and the fourth voltage terminal VDD2 may be changed every predetermined time, so as to shift the operational states of the first noise reduction circuit 108 and the second noise reduction circuit 109.

Figure 4A:
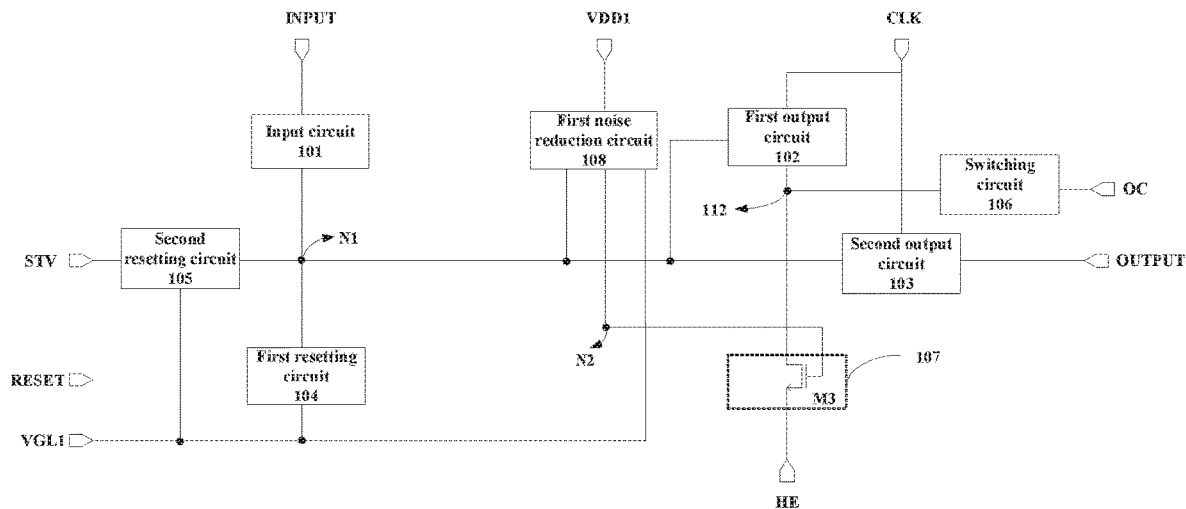
FIG. 4A is a schematic structure view showing a shift register unit according to an implementation of the present disclosure.

In some implementations, the structure of the potential control circuit 107 shown in FIG. 3A may be shown as in FIG. 4A. In some implementations, the structure of the potential control circuit 107 shown in FIG. 3B may be shown as in FIG. 4B.

Figure 4B:
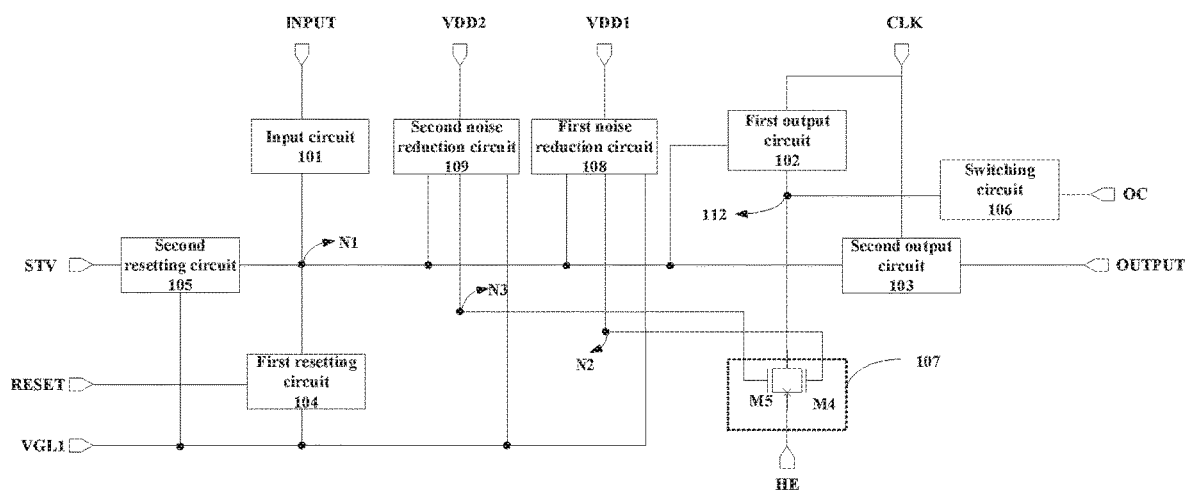
FIG. 4B is a schematic structure view showing a shift register unit according to another implementation of the present disclosure.

FIG. 4A is a schematic structure view showing a shift register unit according to an implementation of the present disclosure. FIG. 4B is a schematic structure view showing a shift register unit according to another implementation of the present disclosure.

As shown in FIG. 4A, the potential control circuit 107 may comprise a third transistor M3.

The control terminal of the third transistor M3 is electrically connected to the second node N2, the first terminal of the third transistor M3 is electrically connected to the output terminal 112 of the first output circuit 102, and the second terminal of the third transistor M3 is electrically connected to the first voltage terminal HE.

For example, the third transistor M3 is an N-type thin film transistor (TFT). In a case where the potential of the second node N2 is at a high level, the third transistor M3 is turned on; and in a case where the potential of the second node N2 is at a low level, the third transistor M3 is turned off.

In the above embodiments, the potential control circuit 107 may control the output terminal 112 of the first output circuit 102 to be of the potential of the second reset signal of the second reset terminal STV under control of the potential of the second node N2.

As shown in FIG. 4B, the potential control circuit 107 may comprise a fourth transistor M4 and a fifth transistor M5.

The control terminal of the fourth transistor M4 is electrically connected to the second node N2, the first terminal of the fourth transistor M4 is electrically connected to the output terminal 112 of the first output circuit 102, and the second terminal of the fourth transistor M4 is electrically connected to the first voltage terminal HE. The control terminal of the fifth transistor M5 is electrically connected to the third node N3, the first terminal of the fifth transistor M5 is electrically connected to the output terminal 112 of the first output circuit 102, and the second terminal of the fifth transistor M5 is electrically connected to the first voltage terminal HE.

In the above embodiments, the potential control circuit 107 may control the output terminal 112 of the first output circuit 102 to be of the potential of the first voltage terminal HE under control of the potential of the second node N2 or the third node N3.

It should be understood that the potential of the output terminal 112 of the first output circuit 102 may be at a high level or a low level by changing the potential of the first voltage terminal HE.

Figure 5:
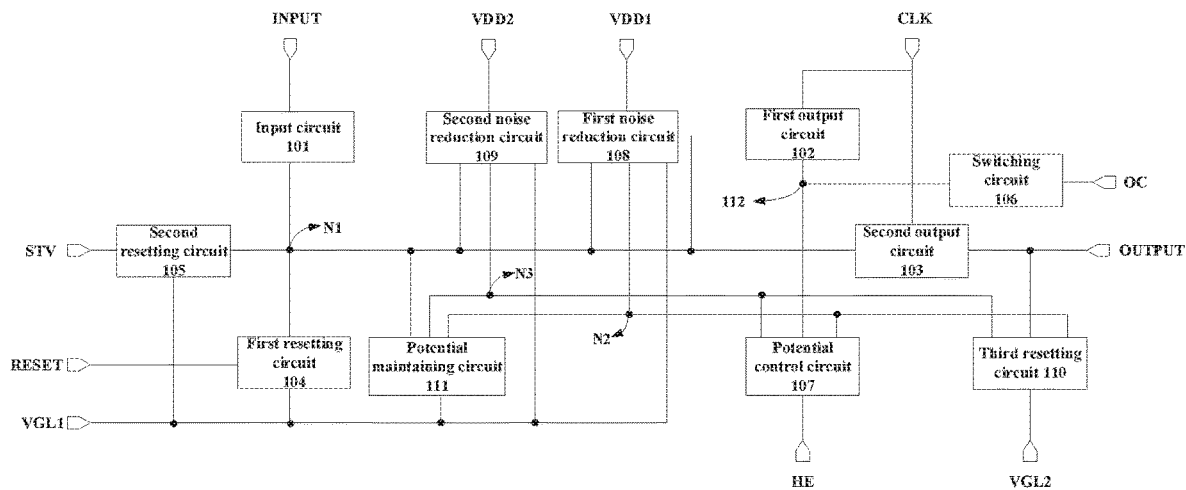
FIG. 5 is a schematic structure view showing a shift register unit according to still another embodiment of the present disclosure.

FIG. 5 is a schematic structure view showing a shift register unit according to still another embodiment of the present disclosure.

Compared with the shift register unit shown in FIG. 3B, the shift register unit shown in FIG. 5 may further comprise a third reset circuit 110 and a potential maintaining circuit 111.

The third reset circuit 110 is electrically connected to the second node N2, the third node N3, and the second output terminal OUTPUT. The third reset circuit 110 is configured to reset the second output terminal OUTPUT under control of one of the potential of the second node N2 and the potential of the third node N3. For example, the potential of the second output terminal OUTPUT may be pulled to the potential of the fifth voltage terminal VGL2 which is at a low level.

The potential maintaining circuit 111 is electrically connected to the first node N1, the second node N2, and the third node N3. The potential maintaining circuit 111 is configured to maintain the potential of the first node N1 under control of one of the potential of the second node N2 and the potential of the third node N3. For example, the potential of the first node N1 may be maintained at the potential of the second voltage terminal VGL1 which is at a low level.

Figure 6:
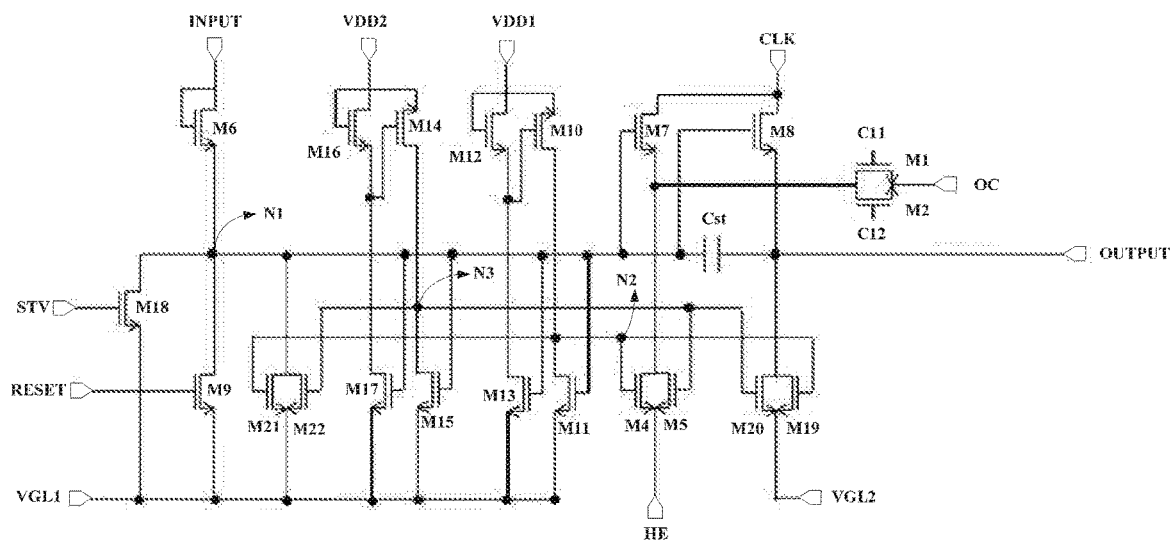
FIG. 6 is a schematic structure view showing a shift register unit according to yet still another embodiment of the present disclosure.

FIG. 6 is a schematic structure view showing a shift register unit according to yet still another embodiment of the present disclosure.

The specific implementation of each circuit in the shift register unit will be described below in conjunction with FIG. 6. It should be understood that although the shift register unit in FIG. 6 shows a specific implementation of each circuit, in some embodiments, one or more circuits are not limited to the implementation shown in FIG. 6.

The switching circuit 106 may comprise a first transistor M1 and a second transistor M2. The control signal for controlling the switching circuit 106 comprise a first control signal C11 and a second control signal C12. The control terminal of the first transistor M1 is configured to receive the first control signal C11, the first terminal of the first transistor M1 is electrically connected to the second terminal of the seventh transistor M7 (i.e., the output terminal 112 of the first output circuit 102), and the second terminal of the first transistor M1 is electrically connected to the first output terminal OC. The control terminal of the second transistor M2 is configured to receive the second control signal C12, the first terminal of the second transistor M2 is electrically connected to the second terminal of the seventh transistor M7, and the first terminal of the second transistor M2 is electrically connected to the first output terminal OC.

The input circuit 101 may comprise a sixth transistor M6. The control terminal and the first terminal of the sixth transistor M6 are electrically connected to the input terminal INPUT, and the second terminal of the sixth transistor M6 is electrically connected to the first node N1.

The first output circuit 102 may comprise a seventh transistor M7. The control terminal of the seventh transistor M7 is electrically connected to the first node N1, the first terminal of the seventh transistor M7 is electrically connected to the clock signal terminal CLK, and the second terminal of the seventh transistor M7 serves as the output terminal 112 of the first output circuit 102.

The second output circuit 103 may comprise an eighth transistor M8 and a capacitor Cst. The control terminal of the eighth transistor M8 is electrically connected to the first node N1, the first terminal of the eighth transistor M8 is electrically connected to the clock signal terminal CLK, and the second terminal of the eighth transistor M8 is electrically connected to the second output terminal OUTPUT. The first terminal of the capacitor Cst is electrically connected to the first node N1, and the second terminal of the capacitor Cst is electrically connected to the second output terminal OUTPUT.

The first reset circuit 104 may comprise a ninth transistor M9. The control terminal of the ninth transistor M9 is configured to receive the first reset signal of the first reset terminal RESET, the first terminal of the ninth transistor M9 is electrically connected to the first node N1, and the second terminal of the ninth transistor M9 is electrically connected to the second voltage terminal VGL1.

The first noise reduction circuit 108 may comprise a tenth transistor M10, an eleventh transistor M11, a twelfth transistor M12, and a thirteenth transistor M13. The first terminal of the tenth transistor M10 is electrically connected to the third voltage terminal VDD1, and the second terminal of the tenth transistor M10 is electrically connected to the second node N2. The control terminal of the eleventh transistor M11 is electrically connected to the first node N1, the first terminal of the eleventh transistor M11 is electrically connected to the second node N2, and the second terminal of the eleventh transistor M11 is electrically connected to the second voltage terminal VGL1. The control terminal and the first terminal of the twelfth transistor M12 are electrically connected to the third voltage terminal VDD1, and the second terminal of the twelfth transistor M12 is electrically connected to the control terminal of the tenth transistor M10. The control terminal of the thirteenth transistor M13 is electrically connected to the first node N1, the first terminal of the thirteenth transistor M13 is electrically connected to the second terminal of the twelfth transistor M12, and the second terminal of the thirteenth transistor M13 is electrically connected to the second voltage terminal VGL1.

The second noise reduction circuit 109 may comprise a fourteenth transistor M14, a fifteenth transistor M15, a sixteenth transistor M16, and a seventeenth transistor M17. The first terminal of the fourteenth transistor M14 is electrically connected to the fourth voltage terminal VDD2, and the second terminal of the fourteenth transistor M14 is electrically connected to the third node N3. The control terminal of the fifteenth transistor M15 is electrically connected to the first node N1, the first terminal of the fifteenth transistor M15 is electrically connected to the third node N3, and the second terminal of the fifteenth transistor M15 is electrically connected to the second voltage terminal VGL1. The control terminal and the first terminal of the sixteenth transistor M16 are electrically connected to the fourth voltage terminal VDD2, and the second terminal of the sixteenth transistor M16 is electrically connected to the control terminal of the fourteenth transistor M14. The control terminal of the seventeenth transistor M17 is electrically connected to the first node N1, the first terminal of the seventeenth transistor M17 is electrically connected to the second terminal of the sixteenth transistor M16, and the second terminal of the seventeenth transistor M17 is electrically connected to the second voltage terminal VGL1.

The second reset circuit 105 may comprise an eighteenth transistor M18. The control terminal of the eighteenth transistor M18 is configured to receive the second reset signal of the second reset terminal STV, the first terminal of the eighteenth transistor M18 is electrically connected to the first node N, and the second terminal of the eighteenth transistor M18 is electrically connected to the second voltage terminal VGL1.

The third reset circuit 110 may comprise a nineteenth transistor M19 and a twentieth transistor M20. The control terminal of the nineteenth transistor M19 is electrically connected to the second node N2, the first terminal of the nineteenth transistor M19 is electrically connected to the second output terminal OUTPUT, and the second terminal of the nineteenth transistor M19 is electrically connected to the fifth voltage terminal VGL2. The control terminal of the twentieth transistor M20 is electrically connected to the third node N3, the first terminal of the twentieth transistor M20 is electrically connected to the second output terminal OUTPUT, and the second terminal of the twentieth transistor M20 is electrically connected to the fifth voltage terminal VGL2.

The potential maintaining circuit 111 may comprise a twenty-first transistor M21 and a twenty-second transistor M22. The control terminal of the twenty-first transistor M21 is electrically connected to the second node N2, the first terminal of the twenty-first transistor M21 is electrically connected to the first node N1, and the second terminal of the twenty-first transistor M21 is electrically connected to the second voltage terminal VGL1. The control terminal of the twenty-second transistor M22 is electrically connected to the third node N3, the first terminal of the twenty-second transistor M22 is electrically connected to the first node N1, and the second terminal of the twenty-second transistor M22 is electrically connected to the second voltage terminal VGL1.

In FIG. 6, the potential control circuit 107 may comprise a fourth transistor M4 and a fifth transistor M5. The control terminal of the fourth transistor M4 is electrically connected to the second node N2, the first terminal of the fourth transistor M4 is electrically connected to the second terminal of the seventh transistor M7 (i.e., the output terminal 112 of the first output circuit 102), and the second terminal of the fourth transistor M4 is electrically connected to the first voltage terminal HE. The control terminal of the fifth transistor M5 is electrically connected to the third node N3, the first terminal of the fifth transistor M5 is electrically connected to the second terminal of the seventh transistor M7, and the second terminal of the fifth transistor M5 is electrically connected to the first voltage terminal HE.

In some embodiments, each transistor in the shift register unit of FIG. 6 may be an N-type TFT. In some embodiments, the active layer of each transistor may comprise, but is not limited to, a semiconductor material such as amorphous silicon or semiconductor oxide.

In some embodiments, the shift register unit comprises all the transistors shown in FIG. 6, namely the first transistor M1, the second transistor M2, the fourth transistor M4 to the twenty-second transistor M22 described above. For the connection relationship between different transistors, reference may be made to the above description, which will not be repeated here.

Figure 7:
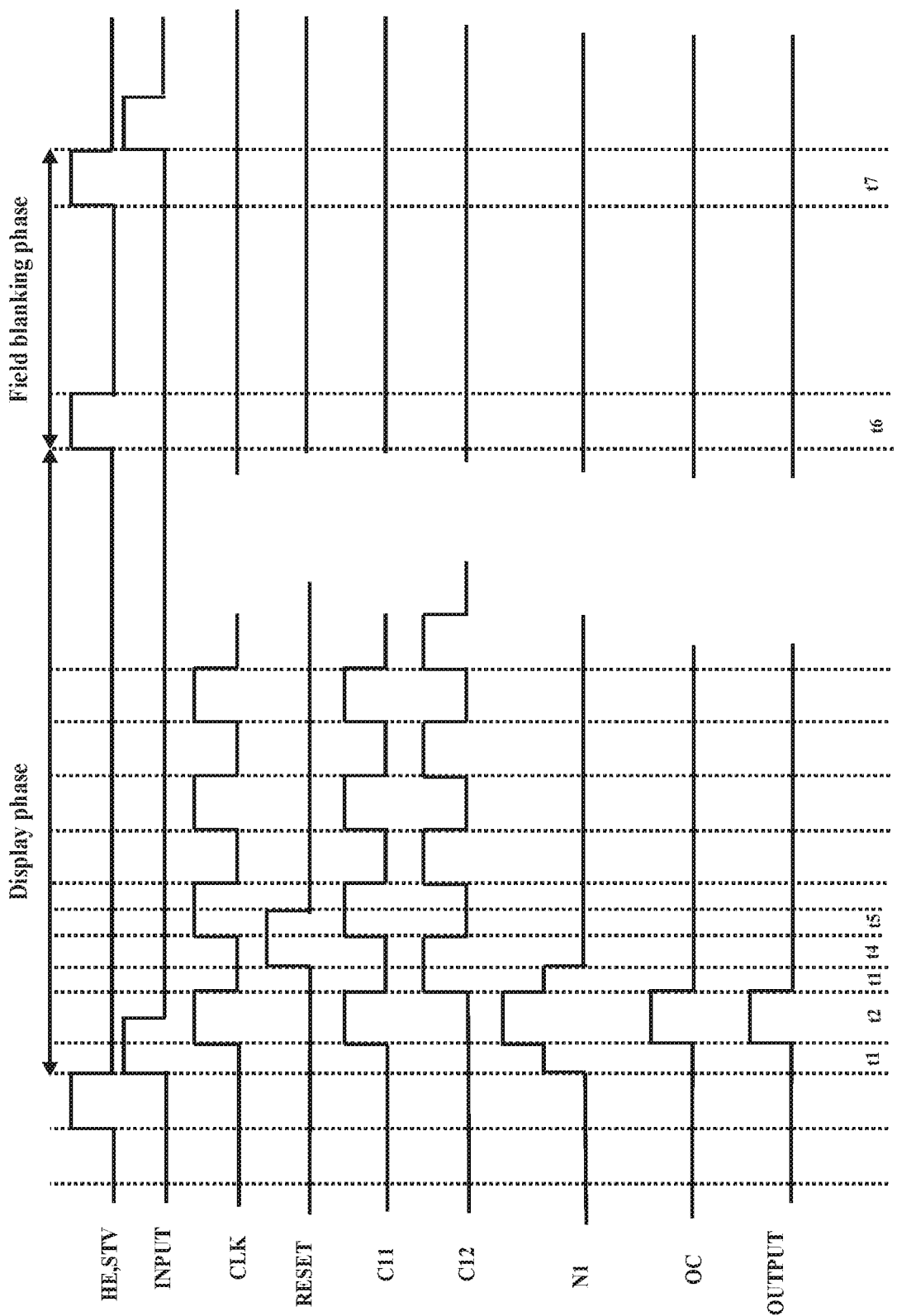
FIG. 7 is a sequence signal view of a shift register unit according to an embodiment of the present disclosure.

FIG. 7 is a sequence signal view of a shift register unit according to an embodiment of the present disclosure. The following will describe the operation process of the shift register unit shown in FIG. 6 by taking each transistor in FIG. 6 which is an N-type TFT as an example in conjunction with FIG. 7.

In FIG. 7, the signals applied to the first voltage terminal HE and the second reset terminal STV are shown as the same signal, that is, the second reset signal. However, this is not restrictive. For example, in other embodiments, the signals applied to the first voltage terminal HE and the second reset terminal STV may also be different.

It should be understood that the time of one frame of image comprises the display phase and the field blanking phase. The stage t1 to the stage t5 are in the display phase, and the stage t6 and the stage t7 are in the field blanking phase. Here, at the stage t1 to the stage t5, the potential of the third voltage terminal VDD1 is at a high level, and the potential of the fourth voltage terminal VDD2 is at a low level. At the stage t6, the potential of the third voltage terminal VDD1 is at a low level, and the potential of the fourth voltage terminal VDD2 is at a high level.

At the stage t1, the input signal of the input terminal INPUT is at a high level, and the clock signal of the clock signal terminal CLK, the first control signal C11, the second control signal C12, the first reset signal of the first reset terminal RESET, and the second reset signal of the first voltage terminal HE and the second reset terminal STV are at a low level. In this case, the sixth transistor M6 is turned on, and the first transistor M, the second transistor M2, the ninth transistor M9, and the eighteenth transistor M18 are turned off. Since the sixth transistor M6 is turned on, the potential of the first node N1 is pulled up, thereby turning on the seventh transistor M7, the eighth transistor M8, the eleventh transistor M11, and the thirteenth transistor M13. In addition, since the potential of the third voltage terminal VDD1 is at a high level, the twelfth transistor M12 is turned on, and the tenth transistor M10 is turned off. Since the eleventh transistor M11 is turned on, the potential of the second node N2 is pulled to the potential of the second voltage terminal VGL1 which is at a low level. The nineteenth transistor M19, the fourth transistor M4, and the twenty-first transistor M21 are turned off in the case where the potential of the second node N2 is pulled down.

At the stage t2, the clock signal of the clock signal terminal CLK and the first control signal C11 are at a high level, and the first reset signal of the first reset terminal RESET, the second control signal C12, and the second reset signal of the first voltage terminal HE and the second reset terminal of STV are at a low level. In this case, the first transistor M1 is turned on, and the second transistor M2 is turned off. Under the bootstrap effect of the capacitor Cst, the potential of the first node N1 is further raised, and the seventh transistor M7 and the eighth transistor M8 remain on. The seventh transistor M7 outputs a carry signal at a high level to the first output terminal OC, and the eighth transistor M8 outputs a driving signal at a high level to the second output terminal OUTPUT.

At the stage t3, the second control signal C12 is at a high level, and the clock signal of the clock signal terminal CLK, the first control signal C11, the first reset signal of the first reset terminal RESET, and the second reset signal of the first voltage terminal HE and the second reset terminal STV are at a low level. In this case, the first transistor M1 is turned off, and the second transistor M2 is turned on. In addition, the potential of the first node N1 drops, but the seventh transistor M7 and the eighth transistor M8 remain on. The seventh transistor M7 outputs a carry signal at a low level to the first output terminal OC, and the eighth transistor M8 outputs a driving signal at a low level to the second output terminal OUTPUT.

At the stage t4, the first reset signal of the first reset terminal RESET and the second control signal C12 are at a high level, and the clock signal of the clock signal terminal CLK, the first control signal C11, and the second reset signal of the first voltage terminal HE and the second reset terminal STV are at a low level. In this case, the ninth transistor M9 and the second transistor M2 are turned on. Since the ninth transistor M9 is turned on, the potential of the first node N1 is pulled to the potential of the second voltage terminal VGL1 which is at a low level. The eleventh transistor M11 and the thirteenth transistor M13 are turned off in the case where the potential of the first node N1 is pulled down, thereby pulling the potential of the second node N2 up to the potential of the third voltage terminal VDD1 which is at a high level. The nineteenth transistor M19, the fourth transistor M4, and the twenty-first transistor M21 are turned on in the case where the potential of the second node N2 is pulled up, thereby pulling the potential of the first node N1 to the potential of the second voltage terminal VGL1 which is at a low level, pulling the potential of the first output terminal OC to the potential of the first voltage terminal HE which is at a low level, and pulling the potential of the second output terminal OUTPUT to the potential of the fifth voltage terminal VGL2 which is at a low level.

At the stage t5, the first reset signal and the first control signal C11 of the first reset terminal RESET are at a high level, and the clock signal of the clock signal terminal CLK, the second control signal C2, and the second reset signal of the first voltage terminal HE and the second reset terminal STV are at a low level. In this case, the ninth transistor M9 and the first transistor M1 are turned on, and the states of the other transistors are the same as the stage t4.

At the stage t6, the second reset signal of the first voltage terminal HE and the second reset terminal STV is at a high level, and the clock signal of the clock signal terminal CLK, the first reset signal of the first reset terminal RESET, the first control signal C11 and the second control signal C12 are at a low level. Similar to the stage t4, the nineteenth transistor M19, the fourth transistor M4, and the twenty-first transistor M21 are turned on in the case where the potential of the second node N2 is pulled up, thereby pulling the potential of the first node N1 to the potential of the second voltage terminal VGL1 which is at a low level, pulling the potential of the first output terminal OC to the potential of the first voltage terminal HE which is at a high level, and pulling the potential of the second output terminal OUTPUT to the potential of the fifth voltage terminal VGL2 which is at a low level. In addition, since the first transistor M1 and the second transistor M2 are turned off, the potential of the first output terminal OC may be maintained at the low level of the stage t4.

The stage t7 is similar to the stage t6, except that at the stage t7, the twentieth transistor M20, the fifth transistor M5, and the twenty-second transistor M22 are turned on in the case where the potential of the third node N3 is pulled up, thereby pulling the potential of the first node N1 to the potential of the second voltage terminal VGL1 which is at a low level, pulling the potential of the first output terminal OC to the potential of the first voltage terminal HE which is at a high level, and pulling the potential of the second output terminal OUTPUT to the potential of the fifth voltage terminal VGL2 which is at a low level.

The present disclosure also provides a gate drive circuit, comprising cascaded multi-stage shift register units. Each stage shift register unit may comprise the shift register unit according to any one of the above embodiments.

Figure 8:
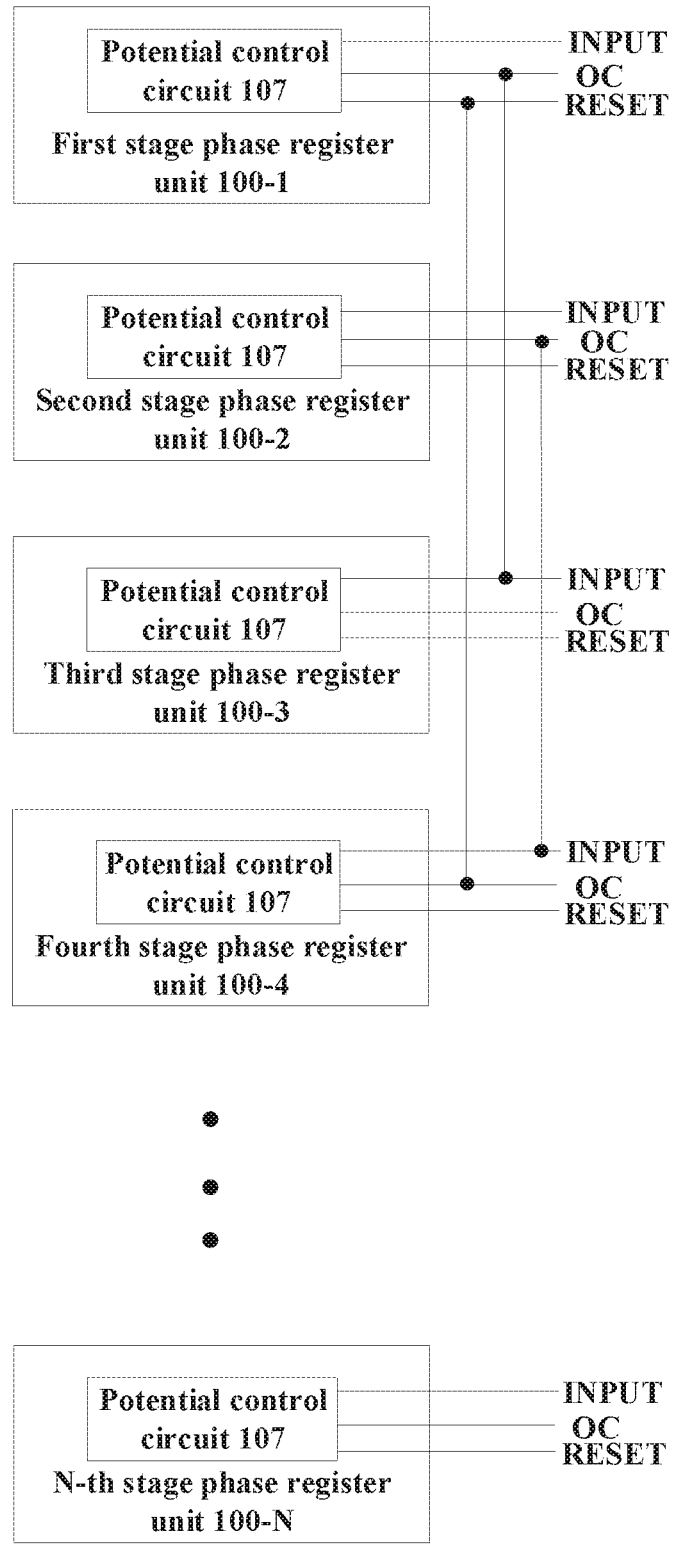
FIG. 8 is a schematic structure view showing a gate drive circuit according to an embodiment of the present disclosure.

FIG. 8 is a schematic structure view showing a gate drive circuit according to an embodiment of the present disclosure. As shown in FIG. 8, the gate drive circuit may comprise cascaded multi-stage shift register units, such as the first stage shift register unit 100-1, the second stage shift register unit 100-2, and the third stage shift register unit 100-3, the fourth stage shift register unit 100-4 ... the N-th stage shift register unit 100-N. Here, N is an integer greater than 0.

In some embodiments, the first output terminal OC of the N-th stage shift register unit may be electrically connected to the input terminal INPUT of the (N+2)-th stage shift register unit, and the first reset terminal RESET of the N-th stage shift register unit may be electrically connected to the first output terminal OC of the shift register unit of the (N+3)-th stage. For example, referring to FIG. 8, the first output terminal OC of the first stage shift register unit 100-1 is electrically connected to the input terminal INPUT of the third stage shift register unit 100-3, and the first reset terminal RESET of the first stage shift register unit 100-1 is electrically connected to the first output terminal OC of the fourth stage shift register unit 100-4.

In some embodiments, the clock signal of the clock signal terminal CLK of the (4n+1)-th stage shift register unit is referred to the first clock signal CLK1, and the clock signal of the clock signal terminal CLK of the (4n+2)-th stage shift register unit is referred to the second clock signal CLK2, the clock signal of the clock signal terminal CLK of the (4n+3)-th stage shift register unit is referred to the third clock signal CLK3, and the clock signal of the clock signal terminal CLK of the (4n+4)-th stage shift register unit is referred to the fourth clock signal CLK4. Here, n is an integer greater than or equal to 0. The first clock signal CLK1 is complementary to the third clock signal CLK2, and the second clock signal CLK3 is complementary to the fourth clock signal CLK4.

In some embodiments, the switching circuit 106 of the i-th stage shift register unit is configured to control the output terminal 112 of the first output circuit 102 of the i-th stage shift register unit to be electrically connected to the first output terminal OC of the i-th stage shift register unit, in response to the first clock signal CLK1 and the third clock signal CLK3. Here, i is an odd number. In other words, for the odd-numbered shift register unit, the first control signal C11 may be the first clock signal CLK1, and the second control signal C12 may be the third clock signal CLK3.

In some embodiments, the switching circuit 106 of the j-th stage shift register unit is configured to control the output terminal 112 of the first output circuit 102 of the j-th stage shift register unit to be electrically connected to the first output terminal OC of the j-th stage shift register unit, in response to the second clock signal CLK2 and the fourth clock signal CLK4. Here, j is an even number. In other words, for the even-numbered shift register unit, the first control signal C11 may be the second clock signal CLK2, and the second control signal C12 may be the fourth clock signal CLK4.

Figure 9:
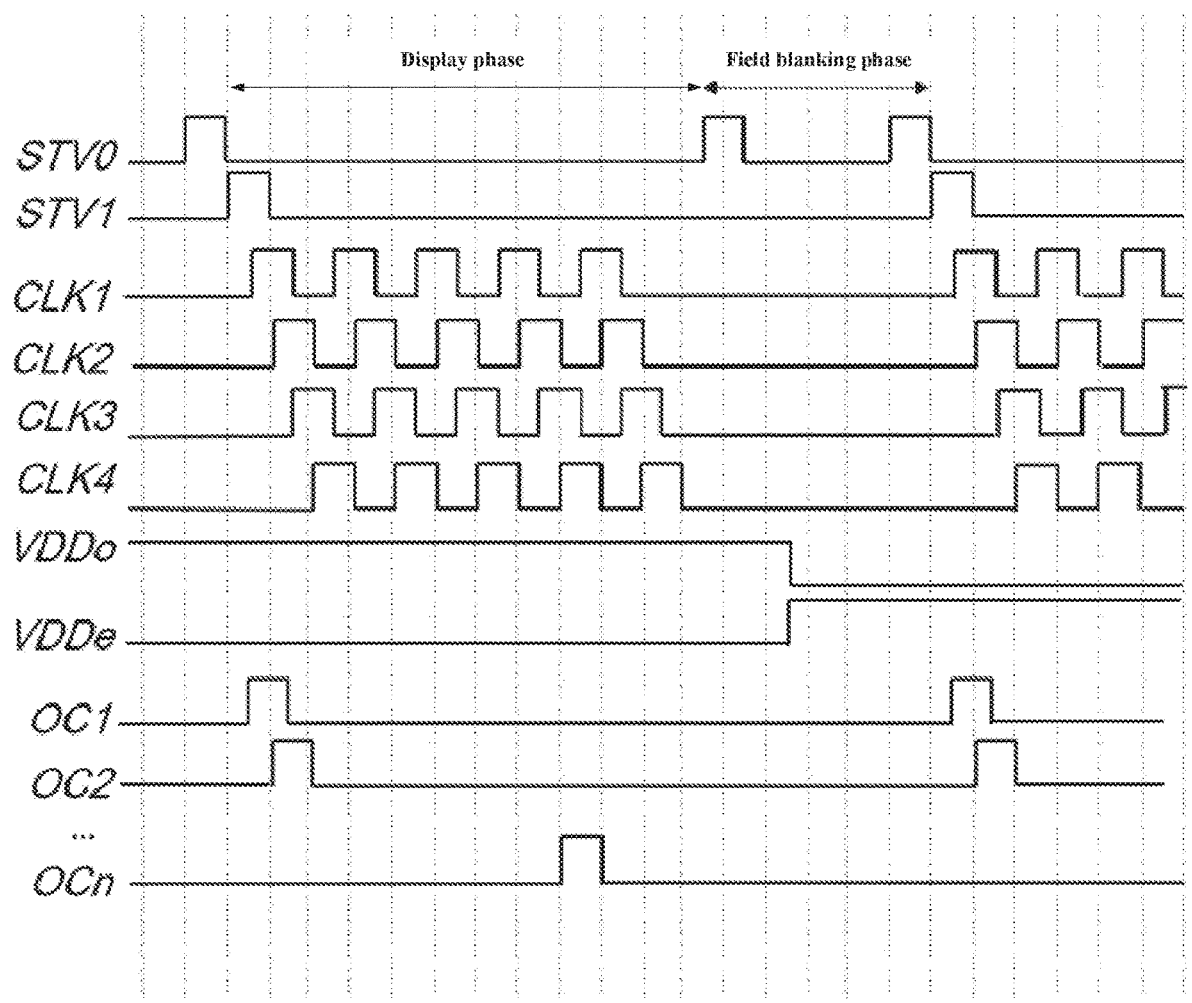
FIG. 9 is a sequence signal view of a gate drive circuit according to an embodiment of the present disclosure.

FIG. 9 is a sequence signal view of a gate drive circuit according to an embodiment of the present disclosure.

In FIG. 9, the first clock signal CLK1 is input to the clock signal terminal CLK of the (4n+1)-th stage shift register unit, the second clock signal CLK2 is input to the clock signal terminal CLK of the (4n+2)-th stage shift register unit, the third clock signal CLK3 is input to the clock signal terminal CLK of the (4n+3)-th stage shift register unit, and the fourth clock signal CLK4 is input to the clock signal terminal CLK of the (4n+4)-th stage shift register unit. The reset signal STV0 is input to the second reset terminal STV of each stage shift register unit. The input signal STV1 is input to the input terminal INPUT of the first two stages of shift register units. VDDo is the voltage signal of the third voltage terminal VDD1, and VDDe is the voltage signal of the fourth voltage terminal VDD2. OC1, OC2 ... OCn are the carry signals output by the first stage shift register unit, the second stage shift register unit, ... and the n-th stage shift register unit respectively.

The embodiments of the present disclosure also provide a display device, which may comprise the gate drive circuit according to any one of the above embodiments. In some embodiments, the display device may be any product or member having a display function, such as a display panel, a mobile terminal, a television, a display, a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A shift register unit, comprising:
    an input circuit electrically connected to a first node, and configured to control a potential of the first node under control of an input signal of an input terminal;
    a first output circuit configured to output a carry signal to a first output terminal of the shift register unit through an output terminal of the first output circuit, under control of the potential of the first node and a clock signal of a clock signal terminal;
    a second output circuit configured to output a driving signal to a second output terminal of the shift register unit, under control of the potential of the first node and the clock signal of the clock signal terminal;
    a switching circuit electrically connected to the output terminal of the first output circuit and the first output terminal, and configured to control whether the output terminal of the first output circuit is electrically connected to the first output terminal in response to a control signal, wherein the control signal comprises a first control signal and a second control signal, and the switching circuit comprises:
  a first transistor, of which a control terminal is configured to receive the first control signal, a first terminal is electrically connected to the output terminal of the first output circuit, and a second terminal is electrically connected to the first output terminal, and
  a second transistor, of which a control terminal is configured to receive the second control signal, a first terminal is electrically connected to the output terminal of the first output circuit, and a second terminal is electrically connected to the first output terminal; and
  a potential control circuit configured to control the output terminal of the first output circuit to be electrically connected to a first voltage terminal.

2. The shift register unit according to claim 1, further comprising:
  a first reset circuit configured to reset the first node in response to a first reset signal of a first reset terminal during a display phase; and
  a second reset circuit configured to reset the first node in response to a second reset signal of a second reset terminal during a field blanking phase.

3. The shift register unit according to claim 1, wherein one of the first control signal and the second control signal is the same as the clock signal.

4. The shift register unit of claim 2, wherein the first voltage terminal is configured to receive the second reset signal.

5. The shift register unit according to claim 2, further comprising:
  a first noise reduction circuit electrically connected to the first node and a second node, and configured to control a potential of the second node to be at a second level logically opposite to a first level in a case where a potential of the first node is at the first level,
  wherein the potential control circuit is electrically connected to the second node.

6. The shift register unit according to claim 5, wherein the potential control circuit comprises:
  a third transistor, of which a control terminal is electrically connected to the second node, a first terminal is electrically connected to the output terminal of the first output circuit, and a second terminal is electrically connected to the first voltage terminal.

7. The shift register unit according to claim 5, further comprising:
  a second noise reduction circuit electrically connected to the first node and a third node, and configured to control the potential of the third node to be at the second level in the case where the potential of the first node is at the first level,
  wherein the potential control circuit is configured to control the output terminal of the first output circuit to be electrically connected to the first voltage terminal under control of one of the potential of the second node and a potential of the third node.

8. The shift register unit according to claim 7, wherein the potential control circuit comprises:
  a fourth transistor, of which a control terminal is electrically connected to the second node, a first terminal is electrically connected to the output terminal of the first output circuit, and a second terminal is electrically connected to the first voltage terminal; and
  a fifth transistor, of which a control terminal is electrically connected to the third node, a first terminal is electrically connected to the output terminal of the first output circuit, and a second terminal is electrically connected to the first voltage terminal.

9. The shift register unit according to claim 8, further comprising:
  a third reset circuit electrically connected to the second node, the third node and the second output terminal, and configured to reset the second output terminal under control of one of the potential of the second node and the potential of the third node; and
  a potential maintaining circuit electrically connected to the first node, the second node and the third node, and configured to maintain the potential of the first node under control of one of the potential of the second node and the potential of the third node.

10. The shift register unit according to claim 9, wherein:
the input circuit comprises:
  a sixth transistor, of which a control terminal and a first terminal are electrically connected to the input terminal, and a second terminal is electrically connected to the first node;
the first output circuit comprises:
  a seventh transistor, of which a control terminal is electrically connected to the first node, a first terminal is electrically connected to the clock signal terminal, and a second terminal serves as the output terminal of the first output circuit;
the second output circuit comprises:
  an eighth transistor, of which a control terminal is electrically connected to the first node, a first terminal of the eighth transistor is electrically connected to the clock signal terminal, and a second terminal is electrically connected to the second output terminal, and
  a capacitor, of which a first terminal is electrically connected to the first node, and a second terminal is electrically connected to the second output terminal;
the first reset circuit comprises:
  a ninth transistor, of which a control terminal is configured to receive the first reset signal, a first terminal is electrically connected to the first node, and a second terminal is electrically connected to a second voltage terminal;
the first noise reduction circuit comprises:
  a tenth transistor, of which a first terminal is electrically connected to a third voltage terminal, and a second terminal is electrically connected to the second node,
  an eleventh transistor, of which a control terminal is electrically connected to the first node, a first terminal is electrically connected to the second node, and a second terminal is electrically connected to the second voltage terminal,
  a twelfth transistor, of which a control terminal and a first terminal are electrically connected to the third voltage terminal, and a second terminal is electrically connected to a control terminal of the tenth transistor, and
  a thirteenth transistor, of which a control terminal is electrically connected to the first node, a first terminal is electrically connected to the second terminal of the twelfth transistor, and a second terminal is electrically connected to the second voltage terminal;
the second noise reduction circuit comprises:

a fourteenth transistor, of which a first terminal is electrically connected to a fourth voltage terminal, and a second terminal is electrically connected to the third node, a fifteenth transistor, of which a control terminal is electrically connected to the first node, a first terminal is electrically connected to the third node, and a second terminal is electrically connected to the second voltage terminal, a sixteenth transistor, of which a control terminal and a first terminal are electrically connected to the fourth voltage terminal, and a second terminal is electrically connected to a control terminal of the fourteenth transistor, and a seventeenth transistor, of which a control terminal is electrically connected to the first node, a first terminal is electrically connected to the second terminal of the sixteenth transistor, and a second terminal is electrically connected to the second voltage terminal;

the second reset circuit comprises:
an eighteenth transistor, of which a control terminal is configured to receive the second reset signal, a first terminal is electrically connected to the first node, and a second terminal is electrically connected to the second voltage terminal;

the third reset circuit comprises:
a nineteenth transistor, of which a control terminal is electrically connected to the second node, a first terminal is electrically connected to the second output terminal, and a second terminal is electrically connected to a fifth voltage terminal, and a twentieth transistor, of which a control terminal is electrically connected to the third node, a first terminal is electrically connected to the second output terminal, and a second terminal is electrically connected to the fifth voltage terminal;

the potential maintaining circuit comprises:
a twenty-first transistor, of which a control terminal is electrically connected to the second node, a first terminal is electrically connected to the first node, and a second terminal is electrically connected to the second voltage terminal, and a twenty-second transistor, of which a control terminal is electrically connected to the third node, a first terminal is electrically connected to the first node, and a second terminal is electrically connected to the second voltage terminal.

11. The shift register unit according to claim 1, wherein the potential control circuit comprises:
a fourth transistor, of which a control terminal is electrically connected to the second node, a first terminal is electrically connected to the output terminal of the first output circuit, and a second terminal is electrically connected to the first voltage terminal, and a fifth transistor, of which a control terminal is electrically connected to the third node, a first terminal is electrically connected to the output terminal of the first output circuit, and a second terminal is electrically connected to the first voltage terminal;

the input circuit comprises:
a sixth transistor, of which a control terminal and a first terminal are electrically connected to the input terminal, and a second terminal is electrically connected to the first node;

the first output circuit comprises:

a seventh transistor, of which a control terminal is electrically connected to the first node, a first terminal is electrically connected to the clock signal terminal, and a second terminal serves as the output terminal of the first output circuit;

the second output circuit comprises:
an eighth transistor, of which a control terminal is electrically connected to the first node, a first terminal of the eighth transistor is electrically connected to the clock signal terminal, and a second terminal is electrically connected to the second output terminal, and a capacitor, of which a first terminal is electrically connected to the first node, and a second terminal is electrically connected to the second output terminal; and the shift register unit further comprises:
a ninth transistor, of which a control terminal is configured to receive the first reset signal, a first terminal is electrically connected to the first node, and a second terminal is electrically connected to a second voltage terminal;

a tenth transistor, of which a first terminal is electrically connected to a third voltage terminal, and a second terminal is electrically connected to the second node;

an eleventh transistor, of which a control terminal is electrically connected to the first node, a first terminal is electrically connected to the second node, and a second terminal is electrically connected to the second voltage terminal;

a twelfth transistor, of which a control terminal and a first terminal are electrically connected to the third voltage terminal, and a second terminal is electrically connected to a control terminal of the tenth transistor; and a thirteenth transistor, of which a control terminal is electrically connected to the first node, a first terminal is electrically connected to the second terminal of the twelfth transistor, and a second terminal is electrically connected to the second voltage terminal;

a fourteenth transistor, of which a first terminal is electrically connected to a fourth voltage terminal, and a second terminal is electrically connected to the third node;

a fifteenth transistor, of which a control terminal is electrically connected to the first node, a first terminal is electrically connected to the third node, and a second terminal is electrically connected to the second voltage terminal;

a sixteenth transistor, of which a control terminal and a first terminal are electrically connected to the fourth voltage terminal, and a second terminal is electrically connected to a control terminal of the fourteenth transistor;

a seventeenth transistor, of which a control terminal is electrically connected to the first node, a first terminal is electrically connected to the second terminal of the sixteenth transistor, and a second terminal is electrically connected to the second voltage terminal;

an eighteenth transistor, of which a control terminal is configured to receive the second reset signal, a first terminal is electrically connected to the first node, and a second terminal is electrically connected to the second voltage terminal;

a nineteenth transistor, of which a control terminal is electrically connected to the second node, a first terminal is electrically connected to the second output terminal, and a second terminal is electrically connected to a fifth voltage terminal;
a twentieth transistor, of which a control terminal is electrically connected to the third node, a first terminal is electrically connected to the second output terminal, and a second terminal is electrically connected to the fifth voltage terminal;
a twenty-first transistor, of which a control terminal is electrically connected to the second node, a first terminal is electrically connected to the first node, and a second terminal is electrically connected to the second voltage terminal; and
a twenty-second transistor, of which a control terminal is electrically connected to the third node, a first terminal is electrically connected to the first node, and a second terminal is electrically connected to the second voltage terminal.

12. A gate drive circuit, comprising cascaded multi-stage shift register units, of which each stage shift register unit comprises:
an input circuit electrically connected to a first node, and configured to control a potential of the first node under control of an input signal of an input terminal;
a first output circuit configured to output a carry signal to a first output terminal of the shift register unit through an output terminal of the first output circuit, under control of the potential of the first node and a clock signal of a clock signal terminal;
a second output circuit configured to output a driving signal to a second output terminal of the shift register unit, under control of the potential of the first node and the clock signal of the clock signal terminal;
a switching circuit electrically connected to the output terminal of the first output circuit and the first output terminal, and configured to control whether the output terminal of the first output circuit is electrically connected to the first output terminal in response to a control signal, wherein the control signal comprises a first control signal and a second control signal, and the switching circuit comprises:
a first transistor, of which a control terminal is configured to receive the first control signal, a first terminal is electrically connected to the output terminal of the first output circuit, and a second terminal is electrically connected to the first output terminal, and
a second transistor, of which a control terminal is configured to receive the second control signal, a first terminal is electrically connected to the output terminal of the first output circuit, and a second terminal is electrically connected to the first output terminal; and
a potential control circuit configured to control the output terminal of the first output circuit to be electrically connected to a first voltage terminal.

13. The gate drive circuit of claim 12, wherein each stage shift register unit further comprises:
a first reset circuit configured to reset the first node in response to a first reset signal of a first reset terminal during a display phase; and
a second reset circuit configured to reset the first node in response to a second reset signal of a second reset terminal during a field blanking phase.

14. The gate drive circuit according to claim 13, wherein:
the first output terminal of a N-th stage shift register unit is electrically connected to the input terminal of a (N+2)-th stage shift register unit, and the first reset terminal of the N-th stage shift register unit is electrically connected to the first output terminal of a (N+3)-th stage shift register unit, wherein N is an integer greater than 0; and
the clock signal of the clock signal terminal of a (4n+1)-th stage shift register unit is a first clock signal, the clock signal of the clock signal terminal of a (4n+2)-th stage shift register unit is a second clock signal, the clock signal of the clock signal terminal of a (4n+3)-th stage shift register is a third clock signal, and the clock signal of the clock signal terminal of a (4n+4)-th stage shift register unit is a fourth clock signal, wherein n is an integer greater than or equal to 0, the first clock signal is complementary to the third clock signal, and the second clock signal is complementary to the fourth clock signal.

15. The gate drive circuit according to claim 14, wherein the switching circuit of a i-th stage shift register unit is configured to control the output terminal of the first output circuit of the i-th stage shift register unit to be electrically connected to the first output terminal of the i-th stage shift register unit, in response to the first clock signal and the third clock signal, wherein i is an odd number.

16. The gate drive circuit according to claim 14, wherein the switching circuit of a j-th stage shift register unit is configured to control the output terminal of the first output circuit of the j-th stage shift register unit to be electrically connected to the first output terminal of the j-th stage shift register unit, in response to the second clock signal and the fourth clock signal, wherein j is an even number.

17. The gate drive circuit according to claim 14, wherein:
the switching circuit of a i-th stage shift register unit is configured to control the output terminal of the first output circuit of the i-th stage shift register unit to be electrically connected to the first output terminal of the i-th stage shift register unit, in response to the first clock signal and the third clock signal, wherein i is an odd number; and
the switching circuit of a j-th stage shift register unit is configured to control the output terminal of the first output circuit of the j-th stage shift register unit to be electrically connected to the first output terminal of the j-th stage shift register unit, in response to the second clock signal and the fourth clock signal, wherein j is an even number.

18. A display device, comprising the gate drive circuit according to claim 12.

19. A driving method of a shift register unit, the shift register unit comprising:
an input circuit electrically connected to a first node, and configured to control a potential of the first node under control of an input signal of an input terminal;
a first output circuit configured to output a carry signal to a first output terminal of the shift register unit through an output terminal of the first output circuit, under control of the potential of the first node and a clock signal of a clock signal terminal;
a second output circuit configured to output a driving signal to a second output terminal of the shift register unit, under control of the potential of the first node and the clock signal of the clock signal terminal;
a switching circuit electrically connected to the output terminal of the first output circuit and the first output terminal, and configured to control whether the output terminal of the first output circuit is electrically connected to the first output terminal in response to a control signal, wherein the control signal comprises a first control signal and a second control signal, and the switching circuit comprises:

a first transistor, of which a control terminal is configured to receive the first control signal, a first terminal is electrically connected to the output terminal of the first output circuit, and a second terminal is electrically connected to the first output terminal, and a second transistor, of which a control terminal is configured to receive the second control signal, a first terminal is electrically connected to the output terminal of the first output circuit, and a second terminal is electrically connected to the first output terminal;

a potential control circuit configured to control the output terminal of the first output circuit to be electrically connected to a first voltage terminal;

a first reset circuit configured to reset the first node in response to a first reset signal of a first reset terminal; and a second reset circuit configured to reset the first node in response to a second reset signal of a second reset terminal;

the driving method comprises:

in a first stage of a display phase, controlling a potential of the first node to be at a first level, and controlling the output terminal of the first output circuit to be electrically connected to the first output terminal, to make the first output circuit output the carry signal to the first output terminal through the output terminal of the first output circuit, and make the second output circuit output the driving signal to the second output terminal;

in a second stage of the display phase, resetting the first node to make the potential of the first node be at a second level, controlling the output terminal of the first output circuit to be electrically connected to the first output terminal, and controlling a potential of the output terminal of the first output circuit to be at the second level, wherein the second level is logically opposite to the first level; and in a field blanking stage, resetting the first node to make the potential of the first node be at the second level, controlling the output terminal of the first output circuit to be disconnected from the first output terminal, and controlling the potential of the output terminal of the first output circuit to be at the first level.

* * * * *